(12) United States Patent
Ishida

(10) Patent No.: US 7,409,307 B2
(45) Date of Patent: Aug. 5, 2008

(54) CALIBRATION APPARATUS, CALIBRATION METHOD, TESTING APPARATUS, AND TESTING METHOD

(75) Inventor: Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/407,588

(22) Filed: Apr. 20, 2006

(65) Prior Publication Data
US 2007/0250281 A1    Oct. 25, 2007

(51) Int. Cl.
G01R 35/00    (2006.01)

(52) U.S. Cl. .................. 702/107; 702/106; 702/85; 375/226

(58) Field of Classification Search ......... 702/106–107, 702/85; 375/226
See application file for complete search history.

(56) References Cited

U.S. PATENT DOCUMENTS

2003/0202573 A1* 10/2003 Yamaguchi et al. ......... 375/226
2004/0062301 A1    4/2004 Yamaguchi et al.
2005/0031029 A1* 2/2005 Yamaguchi et al. ......... 375/226

FOREIGN PATENT DOCUMENTS

JP    7321852    * 12/1995
WO    WO-2004031784    4/2004

OTHER PUBLICATIONS

International Search Report issued in PCT/JP2007/058116 dated Jul. 10, 2007 (2 pages).

* cited by examiner

Primary Examiner—John E Barlow, Jr.
Assistant Examiner—Sujoy K Kundu
(74) Attorney, Agent, or Firm—Osha Liang LLP

(57) ABSTRACT

There is provided a calibration apparatus for calibrating a jitter measuring circuit for outputting a jitter measuring signal corresponding to a value of jitter contained in an input signal, having a signal inputting section for sequentially inputting the first input signal having first period and the second input signal having second period to the jitter measuring circuit and a gain calculating section for calculating a gain in the jitter measuring circuit based on the jitter measuring signals to be outputted out of the jitter measuring circuit respectively with respect to the first and second input signals.

11 Claims, 13 Drawing Sheets

CALIBRATION APPARATUS, CALIBRATION METHOD, TESTING APPARATUS, AND TESTING METHOD

BACKGROUND OF THE INVENTION

1. Field of the Invention

The present invention relates to a calibration apparatus, a calibration method, a testing apparatus and a testing method. More specifically, the invention relates to a calibration apparatus for calibrating a jitter measuring circuit for measuring jitter in an input signal.

2. Related Art

Conventionally, there has been known a circuit for measuring jitter on a chip. The circuit measures the jitter of a high-frequency signal generated within the chip and outputs amplitude of the jitter in the signal-under-measurement by converting into amplitude of voltage.

A value of jitter of the signal-under-measurement may be obtained by dividing output amplitude of a jitter measuring circuit by a jitter output gain of the jitter measuring circuit. Conventionally, a designed value based on circuit design is used for the jitter output gain of the jitter measuring circuit. There is also a case of giving a signal having known jitter to the jitter measuring circuit from the outside of the chip to measure the output amplitude of the jitter measuring circuit.

However, with refinement of semiconductor manufacturing process, characteristics of circuit elements such as transistors, resistors, capacitors and the like in the jitter measuring circuit have come to vary widely due to fluctuation of the process. Then, an actual jitter output gain may have a large error to the designed value.

In the method of inputting the signal having the known jitter from the outside of the chip, it is required to input a signal having equal frequency with the high-frequency signal on the chip from the outside so that the characteristic of the jitter measuring circuit is equalized with the case of measuring the high-frequency signal on the chip. However, it is difficult to supply the signal of high frequency of about several GHz for example to the chip from an input pin of the chip.

Still more, because the quality of the high-frequency signal easily deteriorates, the amplitude of the jitter of the signal inputted to the jitter measuring circuit is not equal with the amplitude of jitter in the signal applied from the outside of the chip. Therefore, the amplitude of the jitter of the signal actually inputted to the jitter measuring circuit becomes unclear and it is difficult to accurately obtain the jitter output gain.

Still more, although the jitter output gain may be accurately obtained by inputting the high-frequency signal to the jitter measuring circuit without deteriorating the signal quality, there arises a problem that it requires a great amount of design cost in such a case.

SUMMARY OF THE INVENTION

Accordingly, it is an object of the invention to provide a calibration apparatus, a calibration method, a testing apparatus and a testing method, which are capable of solving the above-mentioned problems. This object may be achieved through the combination of features described in independent claims of the invention. Dependent claims thereof specify preferable embodiments of the invention.

That is, according to a first aspect of the invention, there is provided a calibration apparatus for calibrating a jitter measuring circuit for outputting a jitter measuring signal corresponding to a value of jitter contained in an input signal, having a signal inputting section for sequentially inputting the first input signal having first period and the second input signal having second period to the jitter measuring circuit and a gain calculating section for calculating a gain in the jitter measuring circuit based on the jitter measuring signals to be outputted out of the jitter measuring circuit respectively with respect to the first and second input signals.

The jitter measuring circuit may output the jitter measuring signal presenting level corresponding to a difference between timing of each edge of the input signal and timing of ideal edge and the gain calculating section may calculate the gain in the jitter measuring circuit based on a difference of increment of level of the respective jitter measuring signals corresponding to the first and second input signals and on a periodic difference between the first period and the second period.

The gain calculating section may have an initial adjusting section for adjusting the jitter measuring circuit so that the level of the jitter measuring signal corresponding to respective edges of the first input signal becomes almost constant and a calculating section for calculating the gain in the jitter measuring circuit based on a difference of increment of level of the jitter measuring signal when the second input signal is inputted to the jitter measuring circuit which has been adjusted by the initial adjusting section and on the periodic difference between the first period and the second period.

The gain calculating section may calculate the gain in the jitter measuring circuit based on an inclination of an envelope of the jitter measuring signal.

The gain calculating section may have a period measuring section for measuring periods of the first and second input signals.

The signal inputting section may have a PLL circuit, provided on one and same chip with the jitter measuring circuit, for generating an oscillating signal synchronized with a given reference signal and a period control section for sequentially generating the first and second input signals by varying the period of the reference signal inputted to the PLL.

The signal inputting section may have a voltage controlled oscillator, provided on one and same chip with the jitter measuring circuit, for generating an oscillating signal having period corresponding to given control voltage and a period control section for sequentially generating the first and second input signals by varying a voltage value of the control voltage inputted to the voltage controlled oscillator.

The inputting section may have an oscillator, provided on one and same chip with the jitter measuring circuit, for generating an oscillating signal having period corresponding to given power-supply voltage and a period control section for sequentially generating the first and second input signals by varying a voltage value of the power-supply voltage given to the oscillator.

According to a second aspect of the invention, there is provided a calibration method for calibrating a jitter measuring circuit for outputting a jitter measuring signal corresponding to a value of jitter contained in an input signal, having a signal inputting step of sequentially inputting the first input signal having first period and the second input signal having second period to the jitter measuring circuit and a gain calculating step of calculating a gain in the jitter measuring circuit based on the jitter measuring signals to be outputted out of the jitter measuring circuit respectively with respect to the first and second input signals.

According to a third aspect of the invention, there is provided a testing apparatus for testing a device-under-test, having a jitter measuring circuit for outputting a jitter measuring signal corresponding to a value of jitter contained in an output signal outputted out of the device-under-test, a judging section for judging whether or not the device-under-test is defect-free based on the jitter measuring signal and a calibration apparatus for calibrating the jitter measuring circuit in advance, wherein the calibration apparatus has a signal inputting section for sequentially inputting a first input signal having first period and a second input signal having second period to the jitter measuring circuit and a gain calculating section for calculating a gain in the jitter measuring circuit based on the jitter measuring signals to be outputted out of the jitter measuring circuit respectively with respect to the first and second input signals.

According to a fourth aspect of the invention, there is provided a testing method for testing a device-under-test, having a jitter measuring step of outputting a jitter measuring signal corresponding to a value of jitter contained in an output signal outputted out of the device-under-test, a judging step of judging whether or not the device-under-test is defect-free based on the jitter measuring signal and a calibrating step of calibrating the jitter measuring circuit in advance, wherein the calibrating step includes a signal inputting step of sequentially inputting a first input signal having first period and a second input signal having second period to the jitter measuring circuit, and a gain calculating step of calculating a gain in the jitter measuring circuit based on the jitter measuring signals to be outputted out of the jitter measuring circuit respectively with respect to the first and second input signals.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
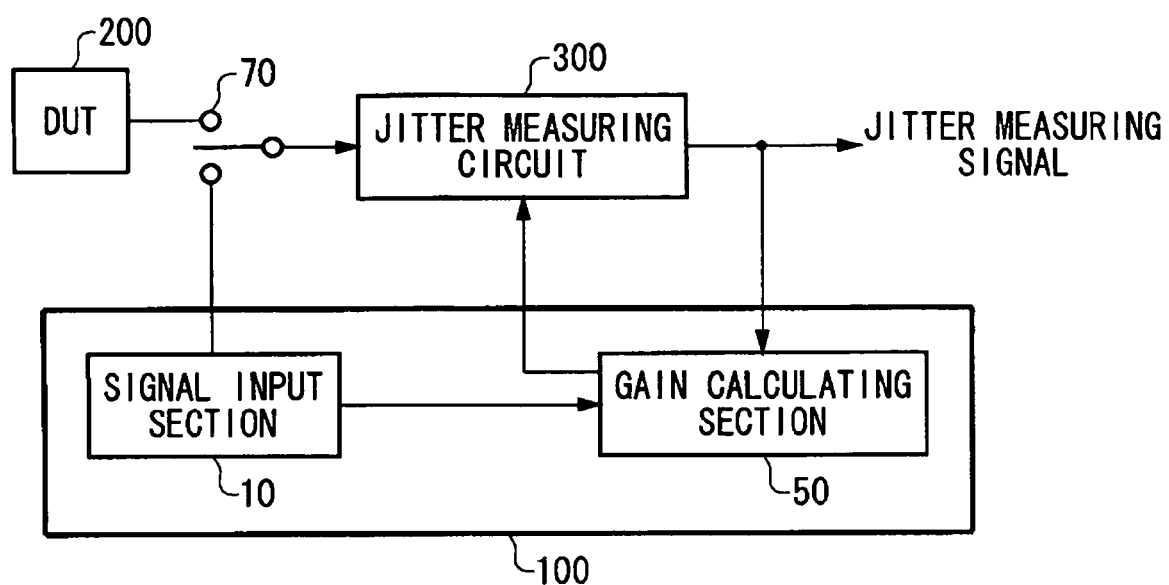
FIG. 1 is a diagram showing one exemplary configuration of a calibration apparatus 100 according to an embodiment of the invention.

FIG. 1 is a diagram showing one exemplary configuration of a calibration apparatus 100 according to an embodiment of the invention. The calibration apparatus 100 calibrates a jitter measuring circuit 300. Here, the jitter measuring circuit 300 is a circuit for measuring amplitude of jitter (value of jitter) contained in an input signal outputted out of an electronic device 200 and for outputting a jitter measuring signal corresponding to the value of jitter. What the calibration of the jitter measuring circuit 300 means is to measure a ratio of signal level of the jitter measuring signal to the value of jitter contained in the input signal of the jitter measuring circuit 300, i.e., to measure a jitter output gain.

The electronic device 200 is a device such as a semiconductor circuit. The electronic device 200 and the jitter measuring circuit 300 may be provided on one and same chip. That is, the electronic device 200 and the jitter measuring circuit 300 may be provided within one and same package.

The calibration apparatus 100 has a signal inputting section 10 and a gain calculating section 50. The signal inputting section 10 sequentially inputs a first input signal having a first period and a second input signal having a second period to the jitter measuring circuit 300. Here, the first and second periods may be what are not set in advance. That is, it will do if a difference of the periods of the first and second input signals is known and the respective periods are not necessary to be known.

The gain calculating section 50 calculates the jitter output gain in the jitter measuring circuit 300 based on the jitter measuring signals outputted out of the jitter measuring circuit 300 with respect to the first and second input signals.

The jitter measuring circuit 300 outputs the jitter measuring signal of signal level corresponding to a difference between ideal timing disposed at predetermined time intervals and edge timing of the input signal. Therefore, when the input signal is jitter-free and the time interval differs from period of the input signal, the jitter measuring circuit 300 outputs a jitter measuring signal having an increment (inclination) of signal level corresponding to the difference between the time interval and the period of the input signal.

That is, the jitter measuring circuit 300 measures an accumulated added value of the differences between the time interval and the period of the input signal as jitter and outputs the jitter measuring signal of signal level obtained by multiplying the accumulated added value of the differences with the jitter output gain. Therefore, when the first and second input signals having different periods are inputted, the accumulation and addition of the differences of the first and second periods is equal with accumulation and addition of differences of inputted value of jitters and the difference of increments of signal level of the respective jitter measuring signals is equal with what the accumulated added value of the difference of the value of jitter is multiplied with the jitter output gain.

Accordingly, the gain calculating section 50 can calculate the jitter output gain of the jitter measuring circuit 300 based on the respective jitter measuring signals outputted out of the jitter measuring circuit 300 with respect to the first and second input signals. For example, the gain calculating section 50 may calculate the jitter output gain of the jitter measuring circuit 300 by dividing the difference of increment of the signal level of the respective jitter measuring signals by the difference of the periods of the first and second input signals. In this case, the signal inputting section 10 may inform the gain calculating section 50 of the difference of the periods or of the periods of the first and second input signals.

The calibration apparatus 100 may further include a switch 70 for switching the input signal from the electronic device 200 or that from the signal inputting section 10 to be inputted to the jitter measuring circuit 300.

Figure 2:
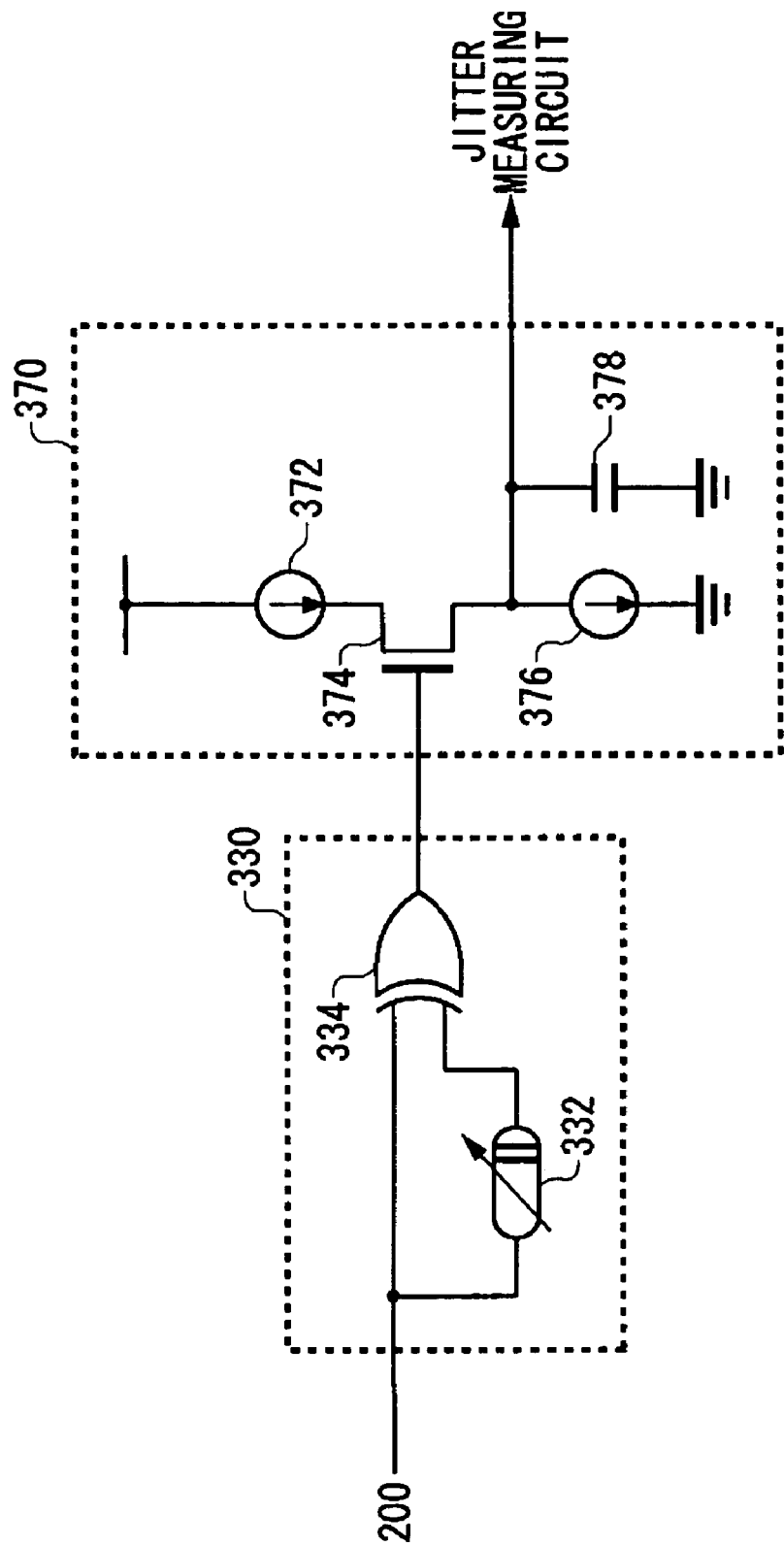
FIG. 2 is a diagram showing one exemplary configuration of a jitter measuring circuit 300.

FIG. 2 is a diagram showing one exemplary configuration of the jitter measuring circuit 300. The jitter measuring circuit 300 of this example has a pulse generator 330 and an integrator 370. The pulse generator 330 outputs a pulse signal having a pulse width set in advance corresponding to edges of the input signal.

The pulse generator 330 has a variable delay circuit 332 and an exclusive OR circuit 334. The variable delay circuit 332 delays the input signal by a value of delay corresponding to a pulse width W that is supposed to be that of the pulse signal outputted out of the pulse generator 330. The exclusive OR circuit 334 outputs exclusive OR of the input signal and the signal outputted out of the variable delay circuit 332. However, the configuration of the pulse generator 330 is not limited to that described above. For example, the pulse generator 330 may be configured by using an AND circuit and the like.

The integrator 370 demodulates timing jitter of the input signal by integrating the pulse signals outputted out of the pulse generator 330. For example, the integrator 370 outputs a jitter measuring signal whose signal level increases with a predetermined rate of increment during when the pulse signal outputted out of the pulse generator 330 presents logic H and whose signal level decreases with a predetermined rate of decrement during when the pulse signal presents logic L.

The integrator 370 can demodulate the timing jitter of the input signal through such operation. However, the operation of the integrator 370 is not limited to the exemplary operation described above. The operation of the integrator 370 will do as long as it can demodulate the timing jitter of the input signal.

The integrator 370 of this example has a source current supply 372, a sink current supply 376, a capacitor 378 and a charge/discharge control section 374. The source current supply 372 generates source current that specifies the rate of increment described above of the jitter measuring signal and the sink current supply 376 generates sink current that specifies the rate of decrement described above of the jitter measuring signal.

The capacitor 378 generates voltage level of the jitter measuring signal by being charged/discharged by the source current supply 372 and the sink current supply 376. The charge/discharge control section 374 charges the capacitor based on the source current during when the pulse signal presents logic H and discharges the capacitor based on the current obtained by subtracting the sink current from the source current during when the pulse signal presents logic L.

Such configuration allows the generation of the jitter measuring signal in which the timing jitter of the input signal is demodulated.

Figure 3:
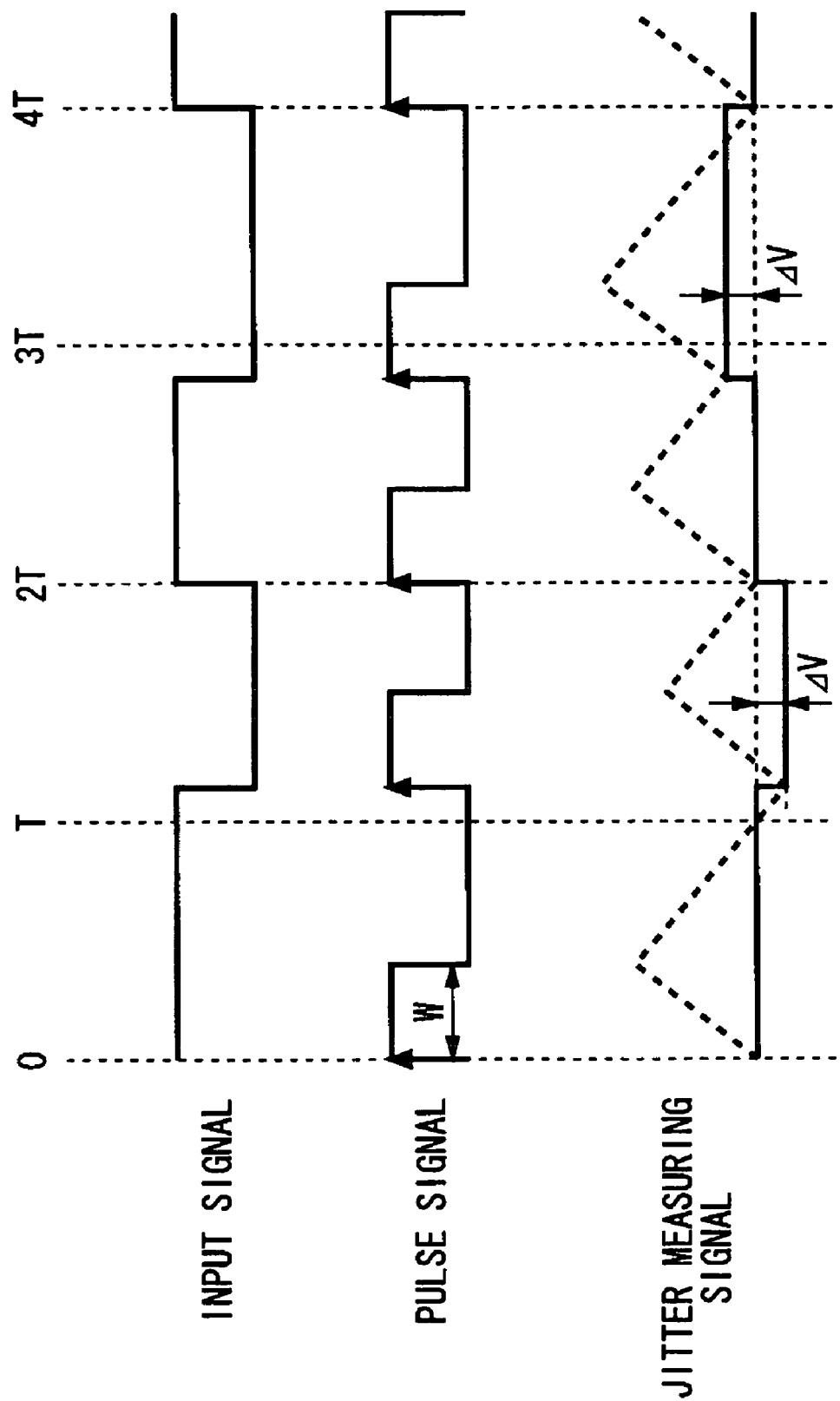
FIG. 3 is a chart showing one exemplary waveform of a jitter measuring signal outputted out of an integrator 370.

FIG. 3 is a chart showing one exemplary waveform of a jitter measuring signal outputted out of the integrator 370. The pulse generator 330 of this example outputs the pulse signal corresponding to rising and falling edges of the input signal.

The integrator 370 outputs the jitter measuring signal whose signal level increases with a predetermined rate of increment during when the pulse signal presents logic H and whose signal level decreases with a predetermined rate of decrement during when the pulse signal presents logic L as described above. In FIG. 3, a dotted line indicates the jitter measuring signal.

When the input signal is jitter-free, extreme values of the jitter signal indicated by the dotted line are kept at predetermined levels. For example, its minimum value is on the level of almost zero and its maximum value is kept on a constant level. However, when the input signal contains timing jitter, the respective extreme values have a difference $\Delta V$ corresponding to a value of jitter from the predetermined level. That is, the jitter measuring signal presents signal level corresponding to the value of jitter contained in the input signal.

The integrator 370 may further include a sample-and-hold circuit for sampling and holding the signal level of the jitter measuring signal at predetermined timing. The sample-and-hold circuit may sample the jitter measuring signal in synchronism with the rising edge of the signal outputted out of the pulse generator 330 and may hold the signal level of the jitter measuring signal sampled as described above during periods other than that. A waveform indicated by a solid line in FIG. 3 represents the jitter measuring signal outputted out of the sample-and-hold circuit in this case.

Thus the jitter measuring circuit 300 outputs the jitter measuring signal presenting the level corresponding to the difference between timing of the edge and timing (0, T, 2T, . . . ) of ideal edge with respect to the respective edges of the input signal. The timing of the ideal edge may be adjusted by controlling source current specifying the rate of increment of the jitter measuring signal indicated by the dotted line and sink current specifying the rate of the decrement.

Figure 4A:
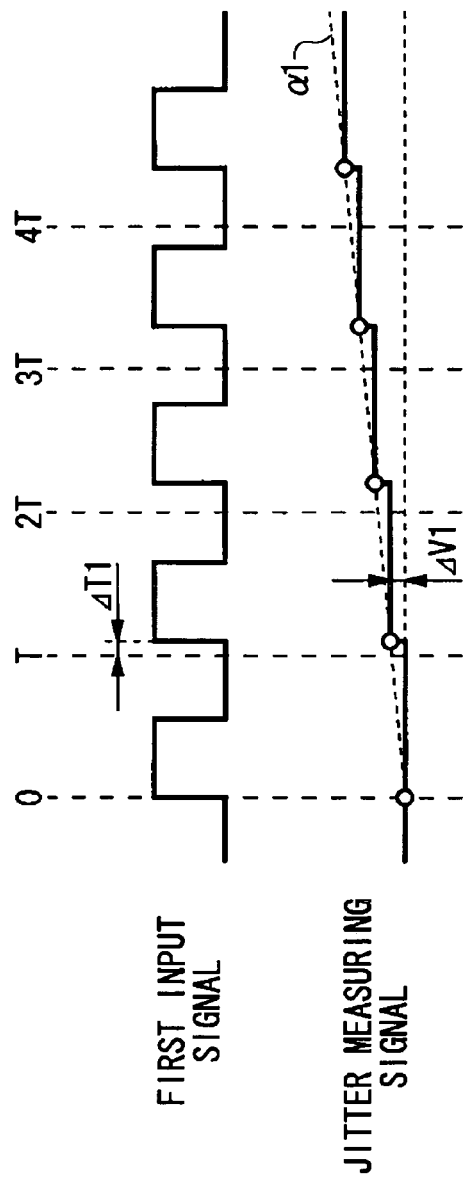
FIGS. 4A and 4B are charts showing first and second input signals generated by a signal inputting section 10 and one exemplary waveform of respective jitter measuring signals.
Figure 4B:
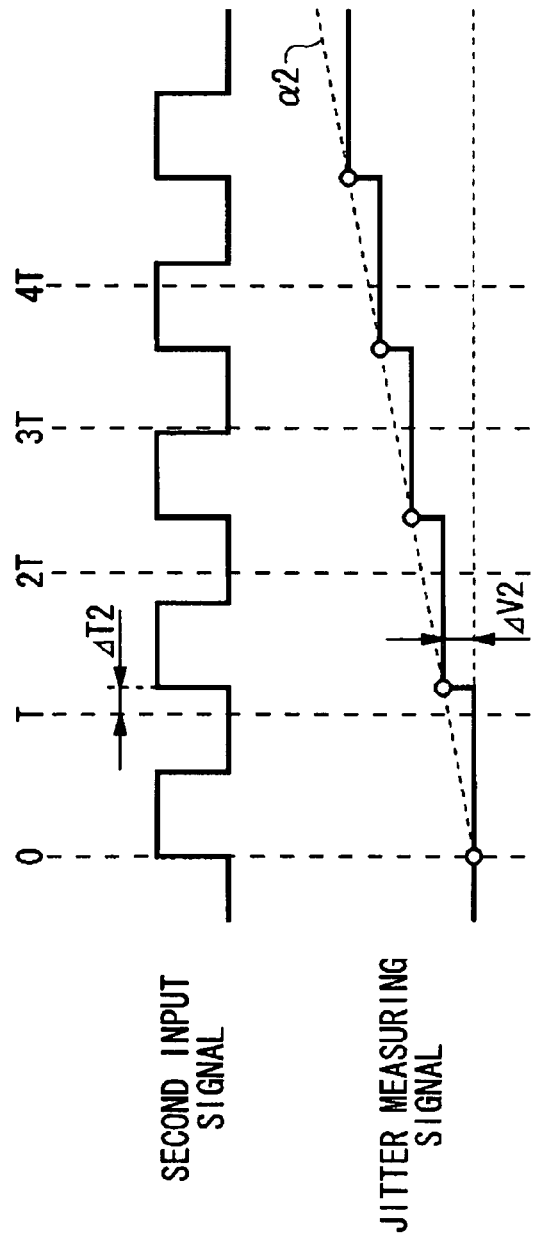

FIGS. 4A and 4B are charts showing first and second input signals generated by the signal inputting section 10 and one exemplary waveform of respective jitter measuring signals. In this example, the difference between the edge of the first input signal and the timing of the ideal edge increases by $\Delta T1$ each in each edge. Still more, the difference between the edge of the second input signal and the timing of the ideal edge increases by $\Delta T2$ each in each edge.

At first, the signal inputting section 10 inputs the first input signal to the jitter measuring circuit 300 as shown in FIG. 4A. Then the jitter measuring circuit 300 outputs a jitter measuring signal presenting level corresponding to the difference between the timing of the edge and the timing of the ideal edge with respect to the respective edges of the first input signal. Here, the level of the jitter measuring signal increases by $\Delta V1$ each corresponding to the respective edges of the first input signal. $\Delta V1$ is a value obtained by multiplying $\Delta T1$ with the jitter output gain of the jitter measuring circuit 300. At this time, the gain calculating section 50 may measure $\Delta V1$.

Next, the signal inputting section 10 inputs the second input signal to the jitter measuring circuit 300 as shown in FIG. 4B. The jitter measuring circuit 300 outputs a jitter measuring signal corresponding to the second input signal. Here, level of the jitter measuring signal increases by $\Delta V2$ each corresponding to the respective edges of the second input signal. $\Delta V2$ is a value obtained by multiplying $\Delta T2$ with the jitter output gain of the jitter measuring circuit 300. At this time, the gain calculating section 50 may measure $\Delta V2$.

The jitter output gain of the jitter measuring circuit 300 is determined by a ratio of fluctuation of signal level of the jitter measuring signal to fluctuation of inputted jitter. The fluctuation of jitter in the first and second input signals corresponds to the difference of periods of the first and second input signals $\Delta T=\Delta T2-\Delta T1$ as described above.

Still more, because the fluctuation of the signal level of the jitter measuring signal to the fluctuation of the jitter corresponds to $\Delta V=\Delta V2-\Delta V1$, the gain calculating section 50 can obtain the jitter output gain of the jitter measuring circuit 300 by dividing $\Delta V$ by $\Delta T$. Here, the difference of period $\Delta T$ is known from the signal inputting section 10.

The jitter output gain of the jitter measuring circuit 300 may be obtained through such operation even if absolute values of period of the respective input signals and the timing of the ideal edges (0, T, 2T, . . . ) in the jitter measuring circuit 300 are unknown.

The signal inputting section 10 may also generate the first and second input signals by controlling period of a signal outputted out of a PLL (Phase Locked Loop) circuit or the like provided on one and same chip with the jitter measuring circuit 300. For example, the signal inputting section 10 may control the period of the first and second input signals by controlling period of a reference signal given to the PLL circuit in controlling the period of the signal outputted out of the PLL circuit. A value of fluctuation of the period of the signal outputted out of the PLL circuit within the chip may be accurately controlled based on a value of fluctuation of period of the reference signal given to the PLL circuit from the outside of the chip.

The calibration apparatus 100 of this example accurately controls a difference of periods of the first and second input signals inputted to the jitter measuring circuit 300 by controlling the period of the reference signal given to the PLL circuit for example. Then, it calculates the jitter output gain of the jitter measuring circuit 300 based on the difference of periods as described above. Therefore, it can accurately obtain the jitter output gain of the jitter measuring circuit 300.

Still more, when the first and second input signals are jitter-free, the gain calculating section 50 can accurately obtain the jitter output gain by dividing the difference of level $\Delta V$ by the difference of period $\Delta T$ as described above. However, when the input signals contain jitter, $\Delta V1$ and $\Delta V2$ are influenced by $\Delta T1$ and $\Delta T2$ and the jitter contained in the respective input signals. Therefore, it is preferable to eliminate the influence of jitter in order to accurately obtain the jitter output gain.

The gain calculating section 50 may calculate the gain in the jitter measuring circuit 300 based on inclination of an envelope of the jitter measuring signal. For instance, the gain calculating section 50 may calculate the gain in the jitter measuring circuit 300 based on a difference of inclination of envelopes $\alpha 1$ and $\alpha 2$ of the respective jitter measuring signals.

The envelope of the jitter measuring signal may be what approximates a group of apexes of respective edges of the jitter measuring signal by a straight line or may be what approximates a group of peaks by a straight line.

When the input signal is jitter-free, the inclination of the envelope is proportional to the jitter output gain of the jitter measuring circuit 300. Still more, even when the input signal contains jitter, the inclination of the envelope is not influenced by random components of the jitter if the input signal is measured for an enough period of time in which plus and minus components of the random components cancel from each other.

Still more, definite components of jitter of the respective input signals are considered to be almost equal, so that it is possible to reduce the influence of the definite components of the jitter by obtaining the difference of inclination of the envelope of the respective jitter measuring signals. The jitter output gain in the jitter measuring circuit 300 may be accurately obtained through such operation.

Figure 5A:
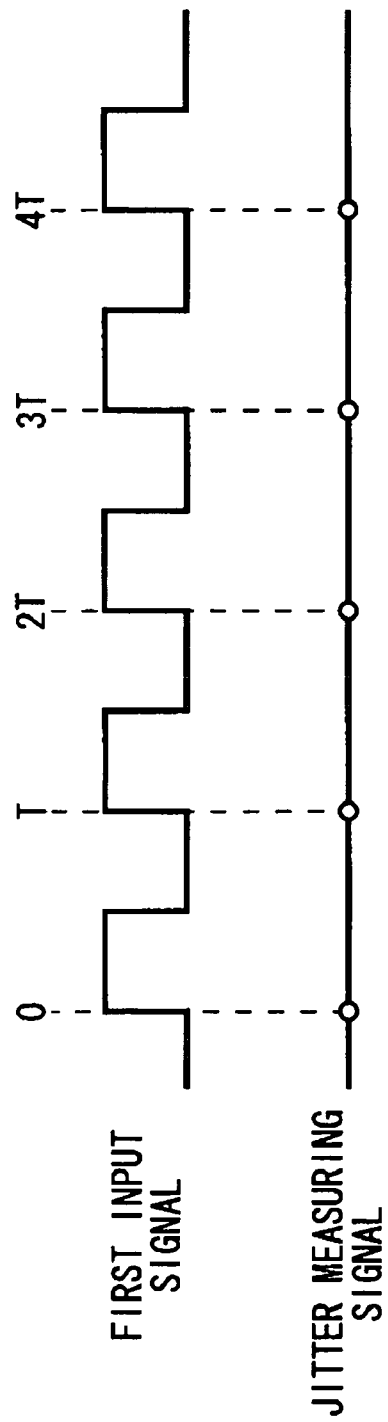
FIGS. 5A and 5B are charts showing first and second input signals generated by the signal inputting section 10 and another exemplary waveform of respective jitter measuring signals.
Figure 5B:
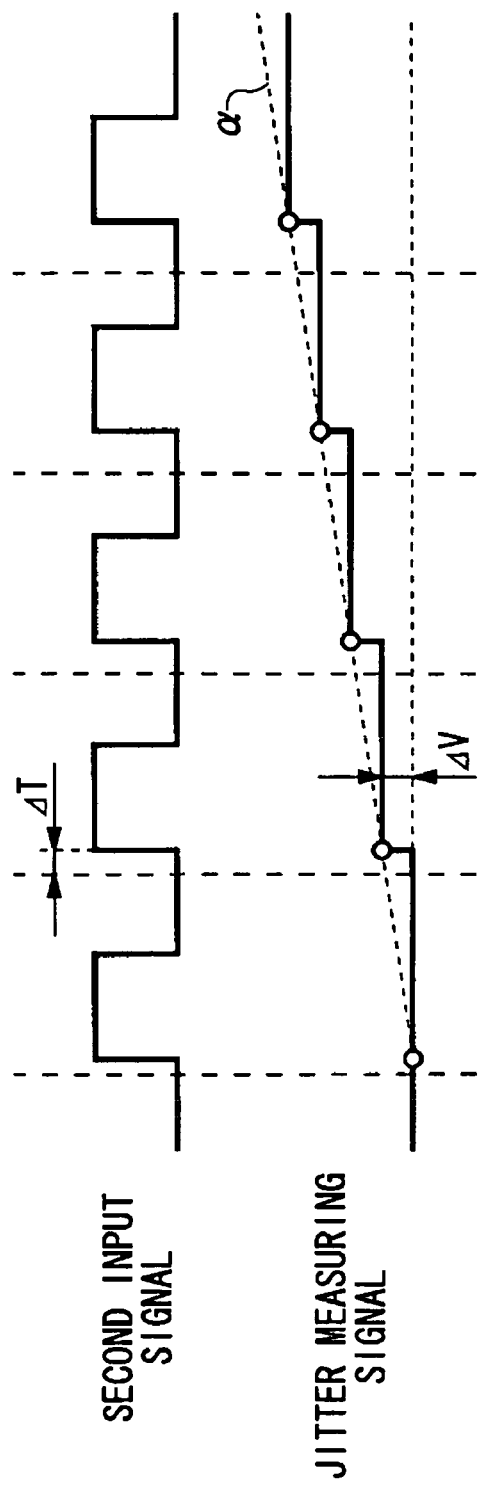

FIGS. 5A and 5B are charts showing the first and second input signals generated by the signal inputting section 10 and another exemplary waveform of respective jitter measuring signals. The calibration apparatus 100 of this example adjusts the jitter measuring circuit 300 so that the jitter measuring signal presents almost constant level when the first input signal is inputted to the jitter measuring circuit 300 as shown in FIG. 5A.

For example, the gain calculating section 50 may adjust the jitter measuring circuit 300 so that the timing intervals (0, t, 2T, . . . ) of the ideal edges in the jitter measuring circuit 300 explained in connection with FIG. 3 almost coincide with the period of the first input signal. In this case, the gain calculating section 50 may adjust the current values in the source current supply 372 and the sink current supply 376 so that the level of the jitter measuring signal becomes almost constant.

Next, the signal inputting section 10 inputs the second input signal to the jitter measuring circuit 300 as shown in FIG. 5B. Suppose that a period of the second input signal is larger than the period of the first input signal by $\Delta T$. In this case, a shift of timing of respective rising edges of the second input signal to the ideal timing increases by $\Delta T$ each. Still more, signal level of the jitter measuring signal increases by $\Delta V$ each corresponding to the rising edges of the second input signal. At this time, $\Delta V$ becomes a value obtained by multiplying $\Delta T$ with the gain of the jitter measuring circuit 300.

$\Delta T$ corresponds to the difference of periods of the first and second input signals explained in FIG. 4, i.e., $\Delta T2-\Delta T1$ and $\Delta V$ corresponds to $\Delta V2-\Delta V1$. Accordingly, the gain calculating section 50 can obtain the gain of the jitter measuring circuit 300 by dividing $\Delta V$ by $\Delta T$. At this time, the gain calculating section 50 may be informed of the difference of periods of the first and second input signals $\Delta T$ from the signal inputting section 10.

Still more, the gain calculating section 50 may obtain the jitter output gain of the jitter measuring circuit 300 based on the inclination of the envelope a of the jitter measuring signal also in this case. Because the inclination of the envelope of the jitter measuring signal corresponding to the first input signal is almost zero in this case, the gain calculating section 50 can obtain the jitter output gain of the jitter measuring circuit 300 based on the inclination of the envelope of the jitter measuring signal corresponding to the second input signal.

The level of the jitter measuring signal is also limited by a capacity of the capacitor 378 shown in FIG. 2 for example. Therefore, it is preferable to set very small $\Delta T$ to a such degree that the level of the jitter measuring signal does not saturate within a predetermined measuring time in obtaining the jitter output gain based on the inclination of the envelope of the jitter measuring signal.

Figure 6:
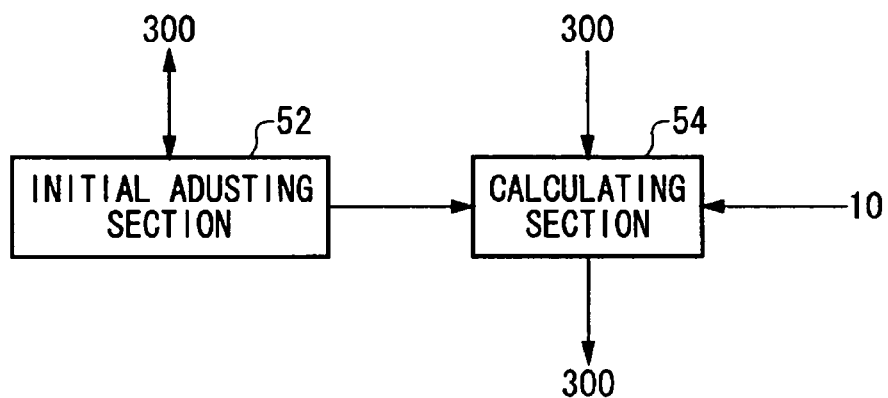
FIG. 6 is a diagram showing one exemplary configuration of a gain calculating section 50.

FIG. 6 is a diagram showing one exemplary configuration of the gain calculating section 50. The gain calculating section 50 of this example adjusts the jitter measuring circuit 300 so that the level of the jitter measuring signal corresponding to the first input signal becomes almost constant as explained in connection with FIG. 5.

The gain calculating section 50 has an initial adjusting section 52 and a calculating section 54. The initial adjusting section 52 adjusts the jitter measuring circuit 300 so that the level of the jitter measuring signal to the respective edges of the first input signal becomes almost constant. The initial adjusting section 52 may adjust the current values in the source current supply 372 and the sink current supply 376 of the jitter measuring circuit 300 so that the level of the jitter measuring signal becomes almost constant as explained in connection with FIG. 5.

The calculating section 54 calculates the jitter output gain in the jitter measuring circuit 300 based on level of the jitter measuring signal when the second input signal is inputted to the jitter measuring circuit 300 that has been adjusted by the initial adjusting section 52 and on the difference of periods of the first and second input signals. The calculating section 54 may calculate the jitter output gain by the method explained in FIG. 5.

The initial adjusting section 52 may also inform the calculating section 54 of that the adjustment of the jitter measuring circuit 300 has been finished. The signal inputting section 10 may inform the calculating section 54 of the difference of the periods of the first and second input signals. The calculating section 54 may inform the jitter measuring circuit 300 of the calculated jitter output gain.

Figure 7:
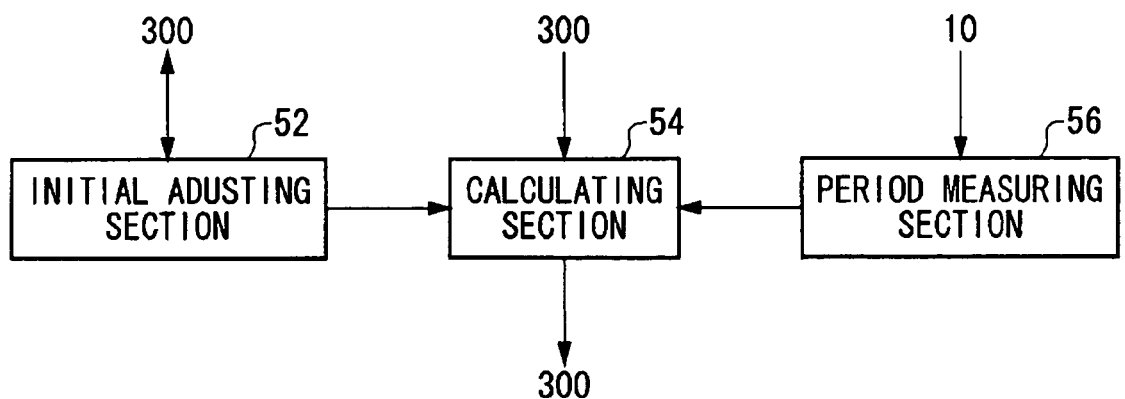
FIG. 7 is a diagram showing another exemplary configuration of the gain calculating section 50.

FIG. 7 is a diagram showing another exemplary configuration of the gain calculating section 50. The gain calculating section 50 of this example further includes a period measuring section 56 in addition to the configuration of the gain calculating section 50 explained in FIG. 6. The other components have the same function with the components denoted by the same reference numerals in FIG. 6.

The period measuring section 56 measure the periods of the first and second input signals. The period measuring section 56 may also measure the difference of periods of the first and second input signals. Based on the measured result of the period measuring section 56, the calculating section 54 calculates the jitter output gain in the jitter measuring circuit 300.

Such configuration allows the jitter output gain in the jitter measuring circuit 300 to be calculated even if the setting of the difference of periods of the first and second input signals generated by the signal inputting section 10 is unknown.

Figure 8A:
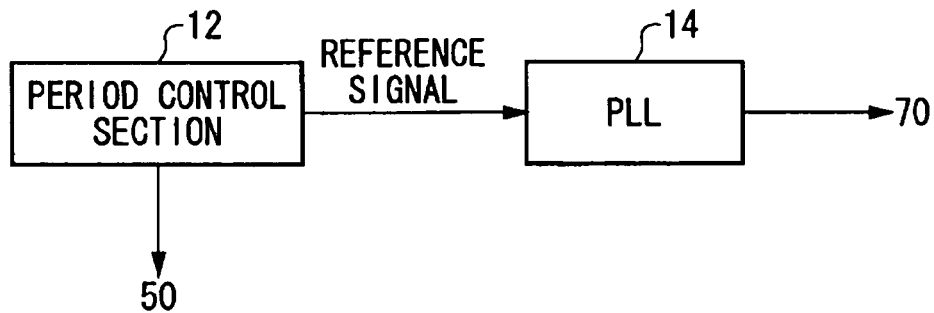
FIGS. 8A, 8B and 8C are diagrams showing one exemplary configuration of the signal inputting section 10.
Figure 8B:
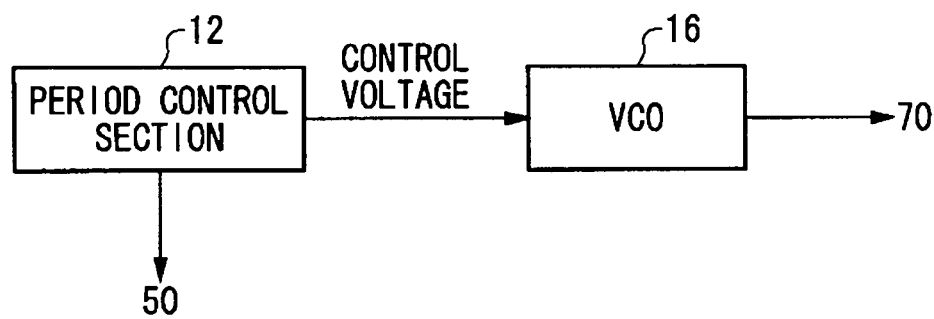
Figure 8C:
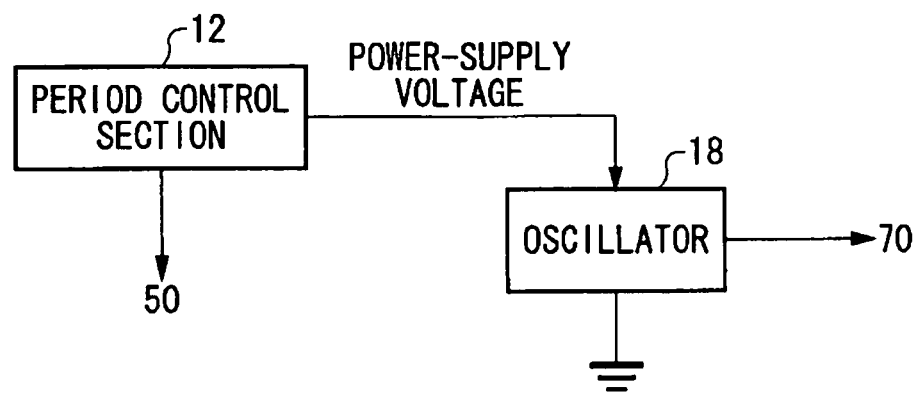

FIGS. 8A, 8B and 8C are diagrams showing one exemplary configuration of the signal inputting section 10.

The signal inputting section 10 shown in FIG. 8A has a period control section 12 and a PLL circuit 14. The PLL circuit 14 is provided within one and same chip with the jitter measuring circuit 300 and generates an oscillating signal synchronized with a given reference signal. The PLL circuit 14 may be a PLL circuit-under-measurement (DUT) that outputs a signal-under-measurement whose jitter is to be measured. The PLL circuit 14 inputs the generated oscillating signal to the jitter measuring circuit 300 as an input signal.

The period control section 12 sequentially generates first and second input signals having a difference of periods corresponding to fluctuation of periods of the reference signal by varying the period of the reference signal inputted to the PLL circuit.

Such configuration allows the difference of periods of the first and second input signals to be inputted to the jitter measuring circuit 300 to be accurately controlled based on the value of fluctuation of the period of the reference signal.

The signal inputting section 10 shown in FIG. 8B has the period control section 12 and a voltage controlled oscillator 16. The voltage controlled oscillator 16 is provided within one and same chip with the jitter measuring circuit 300 and generates an oscillating signal having period corresponding to given control voltage. The voltage controlled oscillator 16 may be a voltage controlled oscillator-under-test (DUT) that outputs a signal-under-measurement whose jitter is to be measured. The voltage controlled oscillator 16 inputs the generated oscillating signal to the jitter measuring circuit 300 as an input signal.

The period control section 12 sequentially generates the first and second input signals having a difference of periods corresponding to fluctuation of voltage value of the control voltage by varying the voltage value of the control voltage to be inputted to the voltage controlled oscillator 16.

Such configuration allows the difference of periods of the first and second input signals to be inputted to the jitter measuring circuit 300 to be accurately controlled based on the value of fluctuation of the voltage value of the control voltage.

The signal inputting section 10 shown in FIG. 8C has the period control section 12 and an oscillator 18. The oscillator 18 is provided within one and same chip with the jitter measuring circuit 300 and generates an oscillating signal having period corresponding to given power-supply voltage. The oscillator 18 may be a ring oscillator for example. The oscillator 18 may be an oscillator-under-test (DUT) that outputs a signal-under-measurement whose jitter is to be measured. The oscillator 18 inputs the generated oscillating signal to the jitter measuring circuit 300 as an input signal.

The period control section 12 sequentially generates the first and second input signals having a difference of periods corresponding to fluctuation of the voltage value of the power-supply voltage by varying the power-supply voltage given to the oscillator 18.

Such configuration allows the difference of periods of the first and second input signals to be inputted to the jitter measuring circuit 300 to be accurately controlled based on the value of fluctuation of the voltage value of the power-supply voltage.

The PLL circuit 14, the voltage controlled oscillator 16 and the oscillator 18 may be the electronic device 200 to be measured as described above. In this case, the signal inputting section 10 does not input the signal directly to the jitter measuring circuit 300 and inputs the first and second input signals to the jitter measuring circuit 300 by controlling the electronic device 200 In such a case, the calibration apparatus 100 is not necessary to have the switch 70 explained in FIG. 1.

Still more, the signal inputting section 10 explained in connection with FIG. 1 may have the period control section 12 for controlling the electronic device 200 in this case.

Figure 9:
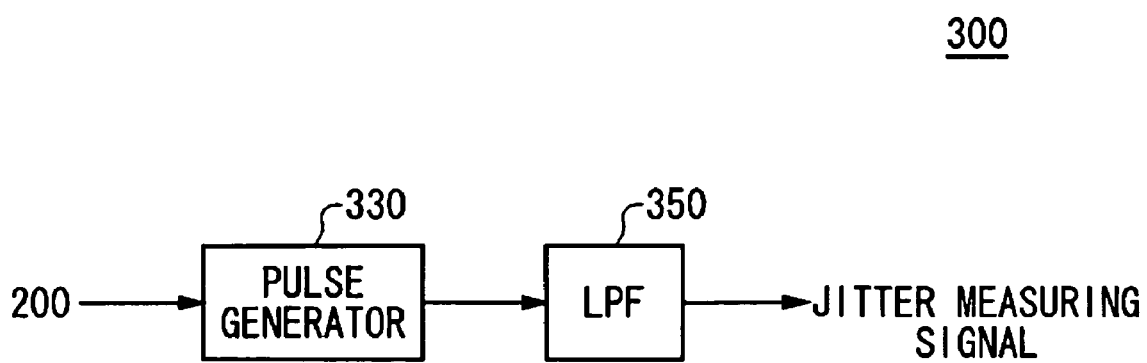
FIG. 9 is a diagram showing another exemplary configuration of the jitter measuring circuit 300.

FIG. 9 is a diagram showing another exemplary configuration of the jitter measuring circuit 300. The jitter measuring circuit 300 of this example is a circuit for outputting a jitter measuring signal demodulating period jitters of an inputted signal and has a pulse generator 330 and a low-pass filter 350.

The pulse generator 330 outputs a pulse signal having a pulse width set in advance corresponding to edges of the input signal. The pulse generator 330 may be the same one with the pulse generator 330 explained in FIG. 2.

The low-pass filter 350 demodulates the period jitter of the input signal by removing a carrier frequency component of the input signal from the pulse signal.

Figure 10:
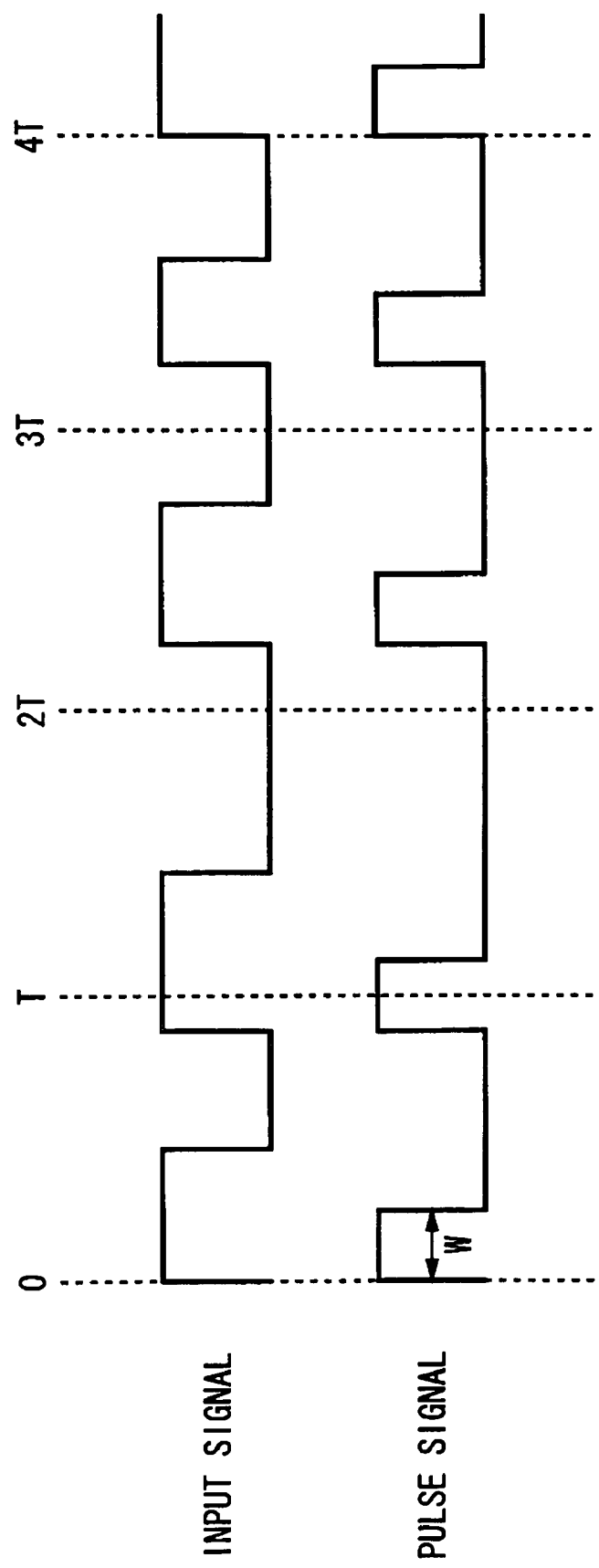
FIG. 10 is a chart showing one exemplary operation of a pulse generator 330 explained in FIG. 9.

FIG. 10 is a chart showing one exemplary operation of the pulse generator 330 explained in FIG. 9. In this example, the pulse generator 330 outputs a pulse signal having a pulse width W set in advance corresponding to rising edges of the input signal.

It is possible to generate a control signal corresponding to period jitter of the input signal by removing a carrier frequency component of the input signal from such pulse signal. The jitter measuring circuit 300 may further include a sample-and-hold circuit for sampling and holding level of the jitter measuring signal outputted out of the low-pass filter 350 with period corresponding to the ideal period of the input signal.

Still more, when the jitter measuring circuit 300 measures the period jitter of the input signal, the signal inputting section 10 may generate an input signal whose period gradually increases or decreases per cycle.

When the input signals having first and second different periods are inputted, a difference of the first and second periods becomes equal to a difference of values of period jitter and a difference of signal level of the respective jitter measuring signals becomes equal to what a difference of the value of jitter is multiplied with the jitter output gain.

Accordingly, the gain calculating section 50 can calculate the jitter output gain of the jitter measuring circuit 300 based on the respective jitter measuring signals outputted out of the jitter measuring circuit 300 with respect to the first and second periods. For example, the gain calculating section 50 may calculate the jitter output gain of the jitter measuring circuit 300 by dividing the difference of the signal level of the respective jitter measuring signals by the difference of the first and second periods. In this case, the signal inputting section 10 may informs the gain calculating section 50 of the difference of the periods or of the first and second periods.

Figure 11:
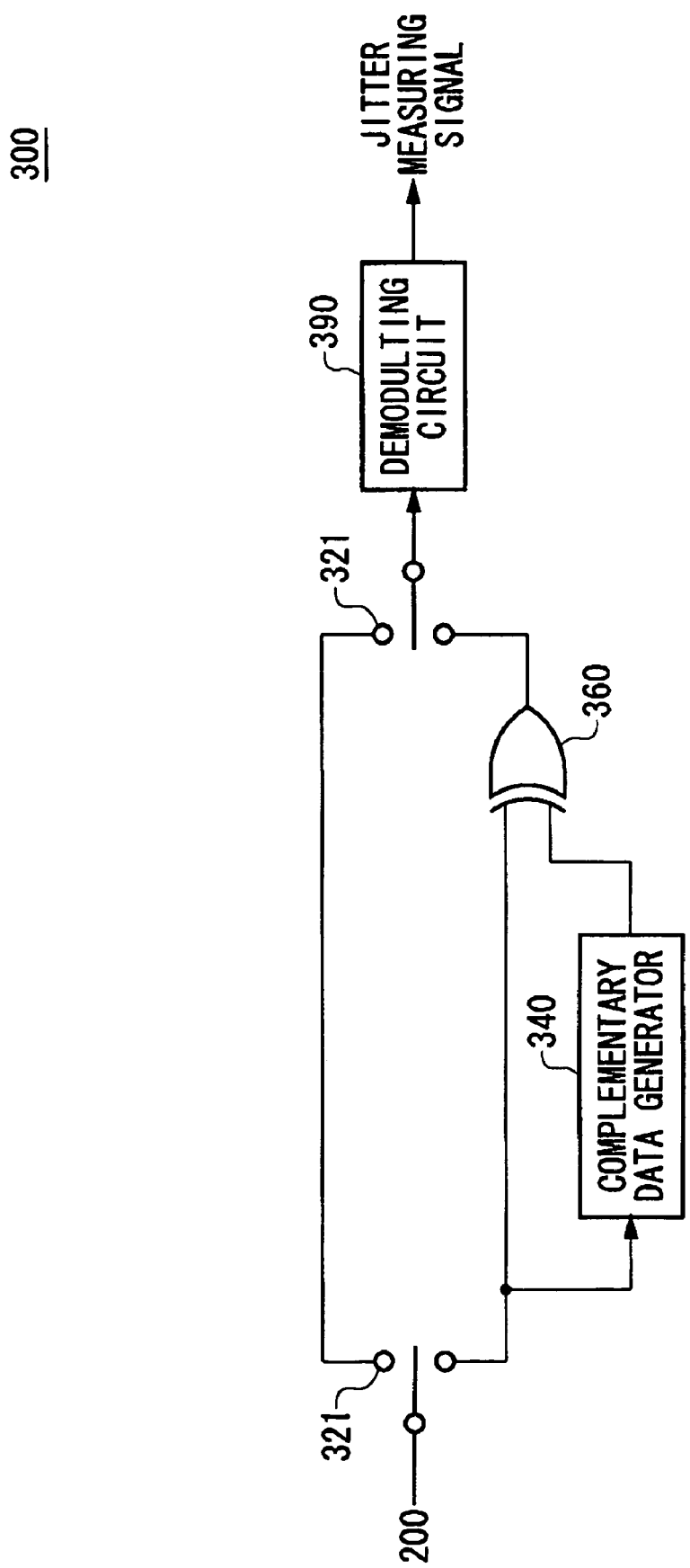
FIG. 11 is a diagram showing another exemplary configuration of the jitter measuring circuit 300.

FIG. 11 is a diagram showing another exemplary configuration of the jitter measuring circuit 300. In this example, the input signal is a data signal and the jitter measuring circuit 300 demodulates jitter of the data signal. The jitter measuring circuit 300 of this example has a complementary data generator 340, an exclusive OR circuit 360 and a demodulating circuit 390.

The complementary data generator 340 generates a complementary data signal whose data value transits at a bit boundary where data value of the data signal does not change.

The exclusive OR circuit 360 outputs an exclusive OR of the data signal and the complementary data signal.

The demodulating circuit 390 demodulates jitter of a signal outputted out of the exclusive OR circuit 360. The demodulating circuit 390 may have the same configuration with the jitter measuring circuit 300 explained in connection with FIG. 2 or with the jitter measuring circuit 300 explained in connection with FIG. 9.

The jitter measuring circuit 300 may further include a switch 321 for switching whether or not to generate the complementary data signal of the input signal. When the input signal is not a data signal, the switch 321 inputs the input signal to the demodulating circuit 390 and when the input signal is a data signal, the switch 321 inputs the input signal to the complementary data generator 340 and the exclusive OR circuit 360.

Figure 12:
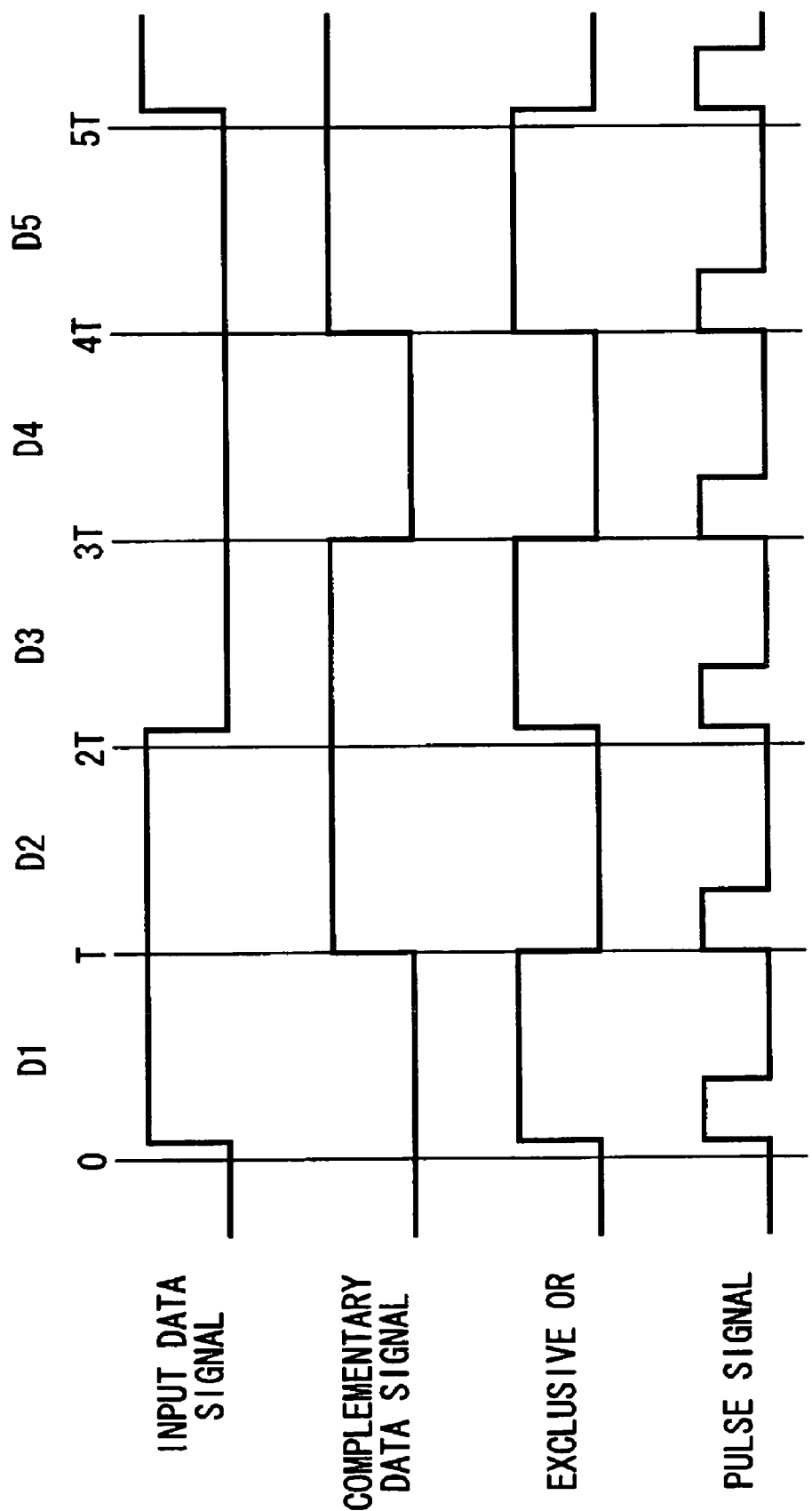
FIG. 12 is a timing chart showing one exemplary operation of a complementary data generator 340.

FIG. 12 is a timing chart showing one exemplary operation of the complementary data generator 340. Receiving the input data signal, the complementary data generator 340 generates a complementary data signal of the input data signal. The complementary data signal is a signal whose edge is provided per boundary of data sections of the input data signal under the condition that a data value of the input data signal does not transit at the boundary of the data section. For example, when edges of the input data signal and those of the complementary data signal are arrayed along one and same time axis, the complementary data signal may be a signal whose edges are arrayed almost at equal time intervals. The data section of the input data signal refers to a time during which one non-continuous data is held in the input data signal serially transmitted for example. In an input data signal that is multi-valued and transmitted, the data section may refer to a time during which symbol data is held. That is, the data section may be a bit interval or may be a symbol interval of the input data signal. For example, the data section of the input data signal is T and a data pattern in a time (0-6T) is 110001 in FIG. 12.

In the example shown in FIG. 12, sections (0-T, T-2T, 3T-4T, . . . ) correspond to the data sections (D1, D2, D3, . . . ). The boundaries of the respective data sections are (0, T, 2t, 3T, . . . ). In this example, the data value of the input data signal transit at the boundaries (0, 2T, 5T) of the data sections and no data value of the input data signal transits at the boundaries (T, 3t, 4T) of the data sections. Therefore, the complementary data generator 340 generates the complementary data signal having edges at the boundaries (T, 3t, 4T) of the data sections where no edge of the input data signal exists.

Because the input data signal has the almost constant data sections, timing of the edges of the input data signal is almost same with either one of the timings (0, T, 2T, . . . ). In such a case, preferably the complementary data generator 340 generates the complementary data signal having edges at the boundaries of the data sections where no edge of the input data signal exists. Thereby, as for the edges of the both input data signal and complementary data signal, the edges are arrayed almost at constant intervals. Such operation enables the jitter measuring circuit 300 to operate almost at constant intervals, to reduce dispersion of its output which is otherwise caused by the difference of operating intervals and others and to accurately demodulate jitter.

The exclusive OR circuit 360 outputs an exclusive OR of the input data signal and the complementary data signal. Thereby, a signal in which edges are arrayed almost constant intervals may be generated. The jitter component of the input data signal is kept in this signal.

The demodulating circuit 390 outputs a pulse signal corresponding to the edges of the signal and demodulates the jitter component based on the pulse signal.

Figure 13:
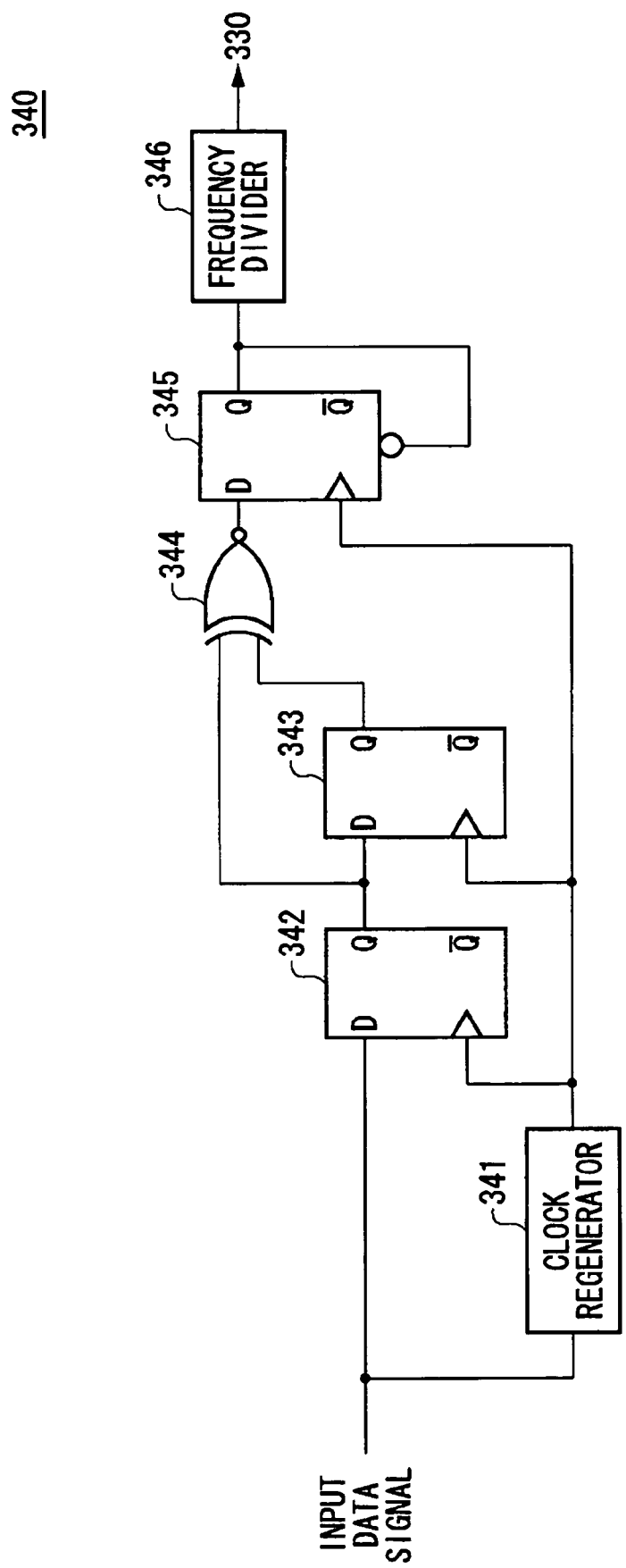
FIG. 13 is a diagram showing one exemplary configuration of the complementary data generator 340.

FIG. 13 is a diagram showing one exemplary configuration of the complementary data generator 340. The complementary data generator 340 of this example has a clock regenerator 341, a first D flip-flop 342, a second D flip-flop 343, a coincidence detector 344, a third D flip-flop 345 and a frequency divider 346.

The clock regenerator 341 generates a clock signal having the almost same period with a data section of the input data signal based on the input data signal. The first D flip-flop 342 takes in and outputs the input data signal corresponding to the clock signal.

The second D flip-flop 343 takes in and outputs a signal outputted out of the first D flip-flop 342 corresponding to the clock signal. That is, the second D flip-flop 343 outputs the signal outputted out of the second D flip-flop 343 by delaying by one period of the data section of the input data signal.

The coincidence detector 344 outputs a coincident signal presenting logic H when a value of the signal outputted out of the first D flip-flop 342 coincides with a value of the signal outputted out of the second D flip-flop 343.

The third D flip-flop 345 takes in and outputs the signal outputted out of the coincidence detector 344 corresponding to the clock signal. The output signal resets the internal data. That is, the third D flip-flop 345 outputs a pulse having a small pulse width that is shorter than the data section of the input data signal when the signal received from the coincidence detector 344 presents a logic value H when in receiving a rising edge of the clock signal.

The frequency divider 346 divides frequency of the signal outputted out of the third D flip-flop 345 into a half to generate the complementary data signal. Here, dividing frequency into a half means to generate a signal whose logic value transits corresponding to either the rising edge or the falling edge of the signal outputted out of the third D flip-flop 345.

Such configuration allows the complementary data signal of the input data signal to be readily generated. The configuration of the complementary data generator 340 is not limited to the exemplary configuration described above. The complementary data generator 340 may be configured variously.

Figure 14:
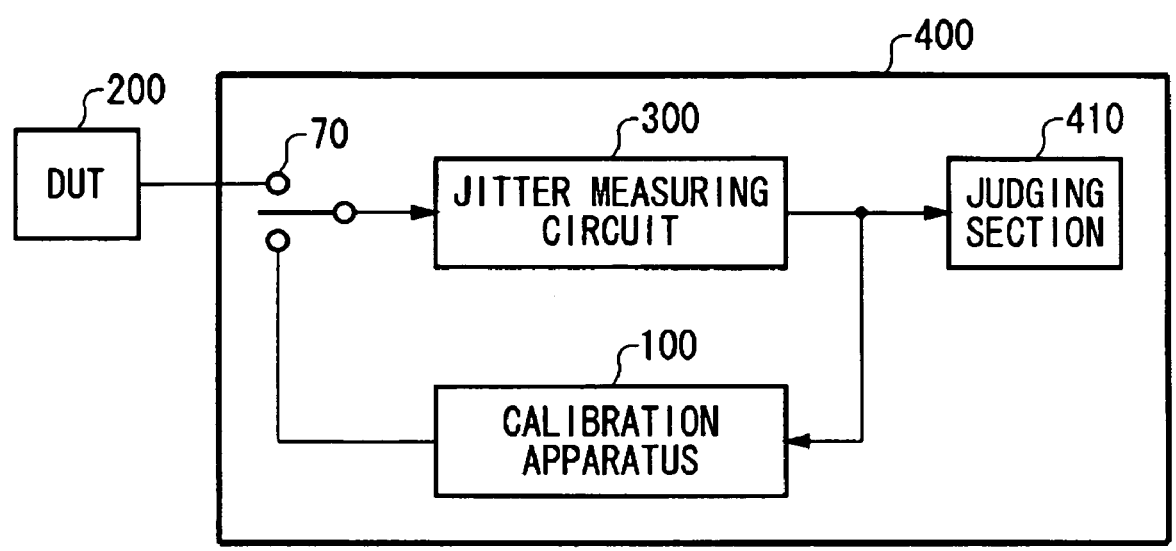
FIG. 14 is a diagram showing one exemplary configuration of a testing apparatus 400 according to another embodiment of the invention.

FIG. 14 is a diagram showing one exemplary configuration of a testing apparatus 400 according to another embodiment of the invention. The testing apparatus 400 is an apparatus for testing the electronic device 200 such as a semiconductor circuit and has the jitter measuring circuit 300, the calibration apparatus 100 and a judging section 410. The jitter measuring circuit 300 and the calibration apparatus 100 are the same one with the jitter measuring circuit 300 and the calibration apparatus 100 explained in connection with FIGS. 1 through 13.

The judging section 410 judges whether or not the electronic device 200 is defect-free based on the jitter measuring signal outputted out of the jitter measuring circuit 300 and the gain calculating section calculated by the calibration apparatus 100 with respect to the signal-under-measurement outputted out of the electronic device 200. For instance, the judging section 410 may judge whether or not the electronic device 200 is defect-free based on whether a value obtained by dividing the level of the jitter measuring signal by the jitter output gain falls within a predetermined range.

The jitter measuring circuit 300 may be also provided within the electronic device 200. In this case, the testing apparatus 400 is not required to have the jitter measuring circuit 300. The calibration apparatus 100 can accurately calculate the jitter output gain of the jitter measuring circuit 300 even when the jitter measuring circuit 300 is provided within the electronic device 200 as described above. Therefore, it is possible to accurately judge whether or not the electronic device 200 is defect-free.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention allows the jitter output gain of the jitter measuring circuit to be accurately calculated. Still more, it allows the device-under-test to be accurately judged whether or not it is defect-free.

Specifically, it allows the jitter output gain of the jitter measuring circuit to be accurately calculated when the jitter measuring circuit is provided within the device-under-test.

What is claimed is:

1. A calibration apparatus for calibrating a jitter measuring circuit for outputting a jitter measuring signal indicating an amount of jitter contained in an input signal, comprising:
   a signal inputting section for sequentially inputting a first input signal having a first period and a second input signal having a second period to said jitter measuring circuit; and
   a gain calculating section for calculating a gain in said jitter measuring circuit based on said jitter measuring signals to be outputted out of said jitter measuring circuit respectively with respect to said first and second input signals,
   the gain calculating section calculating the gain in said jitter measurement circuit based on a difference between said jitter measuring signal corresponding to said first input signal and said jitter measuring signal corresponding to said second input signal, and a difference between said first period and said second period.

2. The calibration apparatus as set forth in claim 1, wherein said jitter measuring circuit outputs said jitter measuring signal presenting level corresponding to a difference between timing of each edge of said input signal and timing of ideal edge; and the calculations by said gain calculating section is based on a difference of increment of level of said respective jitter measuring signals.

3. The calibration apparatus as set forth in claim 2, wherein said gain calculating section has an initial adjusting section for adjusting said jitter measuring circuit so that the level of said jitter measuring signal corresponding to respective edges of said first input signal becomes almost constant; and a calculating section for calculating the gain in said jitter measuring circuit based on a difference of increment of level of said jitter measuring signal when said second input signal is inputted to said jitter measuring circuit which has been adjusted by said initial adjusting section and on the difference between said first period and said second period.

4. The calibration apparatus as set forth in claim 1, wherein said gain calculating section calculates the gain in said jitter measuring circuit based on an inclination of an envelope of said jitter measuring signal.

5. The calibration apparatus as set forth in claim 3, wherein said gain calculating section has a period measuring section for measuring periods of said first and second input signals.

6. The calibration apparatus as set forth in claim 1, wherein said signal inputting section has a PLL circuit, provided on one and same chip with said jitter measuring circuit, for generating an oscillating signal synchronized with a given reference signal; and a period control section for sequentially generating said first and second input signals by varying the period of said reference signal inputted to said PLL.

7. The calibration apparatus as set forth in claim 1, wherein said signal inputting section has a voltage controlled oscillator, provided on one and same chip with said jitter measuring circuit, for generating an oscillating signal having period corresponding to given control voltage; and a period control section for sequentially generating said first and second input signals by varying a voltage value of said control voltage inputted to said voltage controlled oscillator.

8. The calibration apparatus as set forth in claim 1, wherein said inputting section has an oscillator, provided on one and same chip with said jitter measuring circuit, for generating an oscillating signal having period corresponding to given power-supply voltage; and a period control section for sequentially generating said first and second input signals by varying a voltage value of said power-supply voltage given to said oscillator.

9. A calibration method for calibrating a jitter measuring circuit for outputting a jitter measuring signal indicating an amount of jitter contained in an input signal, comprising:
   a signal inputting step of sequentially inputting a first input signal having a first period and a second input signal having a second period to said jitter measuring circuit;
   a gain calculating step of calculating a gain in said jitter measuring circuit based on said jitter measuring signals to be outputted out of said jitter measuring circuit respectively with respect to said first and second input signals,
   the gain calculating step calculating the gain in said jitter measurement circuit based on a difference between said jitter measuring signal corresponding to said first input signal and said jitter measuring signal corresponding to said second input signal, and a difference between said first period and said second period; and
   an outputting step of outputting the calculated gain.

10. A testing apparatus for testing a device-under-test, comprising:
   a jitter measuring circuit for outputting a jitter measuring signal corresponding to a value of jitter contained in an output signal outputted out of said device-under-test;
   a judging section for judging whether or not said device-under-test is defect-free based on said jitter measuring signal; and a calibration apparatus for calibrating said jitter measuring circuit in advance;

wherein said calibration apparatus has a signal inputting section for sequentially inputting a first input signal having first period and a second input signal having second period to said jitter measuring circuit; and a gain calculating section for calculating a gain in said jitter measuring circuit based on said jitter measuring signals to be outputted out of said jitter measuring circuit respectively with respect to said first and second input signals, the gain calculating section calculating the gain in said jitter measurement circuit based on a difference between said jitter measuring signal corresponding to said first input signal and said jitter measuring signal corresponding to said second input signal, and a difference between said first period and said second period.

11. A testing method for testing a device-under-test, comprising:

a jitter measuring step of outputting a jitter measuring signal corresponding to a value of jitter contained in an output signal outputted out of said device-under-test;

a judging step of judging whether or not said device-under-test is defect-free based on said jitter measuring signal;

a calibrating step of calibrating said jitter measuring circuit in advance;

wherein said calibrating step includes a signal inputting step of sequentially inputting a first input signal having first period and a second input signal having second period to said jitter measuring circuit;

a gain calculating step of calculating a gain in said jitter measuring circuit based on said jitter measuring signals to be outputted out of said jitter measuring circuit respectively with respect to said first and second input signals, the gain calculating step calculating the gain in said jitter measurement circuit based on a difference between said jitter measuring signal corresponding to said first input signal and said jitter measuring signal corresponding to said second input signal, and a difference between said first period and said second period; and an outputting step of outputting the calculated gain.

* * * * *